US007768818B1

(12) United States Patent
Chan et al.

(10) Patent No.: US 7,768,818 B1
(45) Date of Patent: Aug. 3, 2010

(54) INTEGRATED CIRCUIT MEMORY ELEMENTS

(75) Inventors: Mark T. Chan, San Jose, CA (US); Lin-Shih Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 198 days.

(21) Appl. No.: 12/057,339

(22) Filed: Mar. 27, 2008

(51) Int. Cl.
*G11C 7/00* (2006.01)

(52) U.S. Cl. ............. 365/154; 365/189.02; 365/189.15; 365/189.16

(58) Field of Classification Search .................. 365/154, 365/189.02, 189.15, 189.16
See application file for complete search history.

(56) References Cited

U.S. PATENT DOCUMENTS

| 5,487,037 A | 1/1996 | Lee |
| 5,581,505 A | 12/1996 | Lee |
| 5,696,716 A | 12/1997 | Rolandi |
| 6,128,215 A | 10/2000 | Lee |
| 6,144,611 A | 11/2000 | Tarbouriech |
| 6,937,063 B1 | 8/2005 | Sun et al. |
| 6,940,307 B1 * | 9/2005 | Liu et al. ...................... 326/38 |
| 7,023,744 B1 | 4/2006 | Shimanek et al. |
| 7,200,020 B2 * | 4/2007 | Ramaraju et al. ...... 365/189.15 |

* cited by examiner

*Primary Examiner*—Son Dinh
(74) *Attorney, Agent, or Firm*—Treyz Law Group; G. Victor Treyz; David C. Kellogg

(57) ABSTRACT

Memory elements for integrated circuit are provided that have efficient transistor layouts. The integrated circuits may be programmable logic device integrated circuits on which memory elements are formed into arrays. Each memory element may have a pair of cross-coupled inverters, an address transistor, and a clear transistor. The transistors in each memory element may be formed from n-type and p-type semiconductor regions that are crossed by only three gate conductor fingers. Programmable transistors on the integrated circuit may be controlled by static output signals from the memory elements. The programmable transistors may be used to form multiplexers. The multiplexers may be formed from n-type regions that are crossed by only three gate fingers each. The gate fingers of the multiplexers may be aligned with the gate fingers of the transistor structures of the memory elements.

20 Claims, 10 Drawing Sheets

INTEGRATED CIRCUIT MEMORY ELEMENTS

BACKGROUND

This invention relates to integrated circuits, and more particularly, to memory elements in integrated circuits.

Integrated circuits often contain memory elements. Memory elements may be based on cross-coupled inverters and may be used to store data. Each memory element may store a single bit of data.

Memory elements are often arranged in arrays. In a typical array, data lines are used to write data into the memory elements and are used to read data from memory elements that have been loaded with data. Address lines may be used to select which of the memory elements are being accessed. In some arrangements, clear lines are used to clear the memory elements.

In modern integrated circuit designs, care must be taken to design memory element cells so that they consume relatively small amounts of circuit real estate. This can be difficult using conventional memory cell transistor designs based on n-channel metal-oxide-semiconductor clear transistors. Although such conventional designs may operate satisfactorily, layout considerations may make it difficult or impossible to minimize the amount of circuit area consumed by each memory cell as much as desired. Conventional memory element designs may also make it difficult to shrink the size of circuit components such as programmable multiplexers.

It would therefore be desirable to provide improved ways in which to form memory elements and programmable structures such as multiplexers on integrated circuits.

SUMMARY

In accordance with the present invention, integrated circuits are provided that contain memory elements. The memory elements may be organized into an array. On integrated circuits such as programmable logic device integrated circuits, the memory elements may be loaded with configuration data. Each memory element may produce a static output signal at its output that is applied to the gate of a corresponding programmable transistor. At least some of the programmable transistors may be used to form programmable multiplexers. For example, six transistors may be used to form a 6:3 multiplexer.

Each memory element may have a pair of cross-coupled inverters, an address transistor, and a p-channel metal-oxide-semiconductor clear transistor.

The transistors in the memory elements may be formed from n-type and p-type semiconductor regions. To improve layout efficiency, each semiconductor region may be traversed by only three gate conductors. The transistors in the multiplexers may be formed using one or more n-type regions. For example, in a 6:3 multiplexer, there may be three n-type regions that are used in forming six n-channel programmable transistors for the multiplexer. The three n-type regions may each be crossed by only three gate fingers. The gate fingers of the multiplexer may be aligned with the gate fingers that cross the n-type semiconductor and p-type semiconductor regions in associated memory elements.

Further features of the invention, its nature and various advantages will be more apparent from the accompanying drawings and the following detailed description of the preferred embodiments.

DETAILED DESCRIPTION

Figure 1:
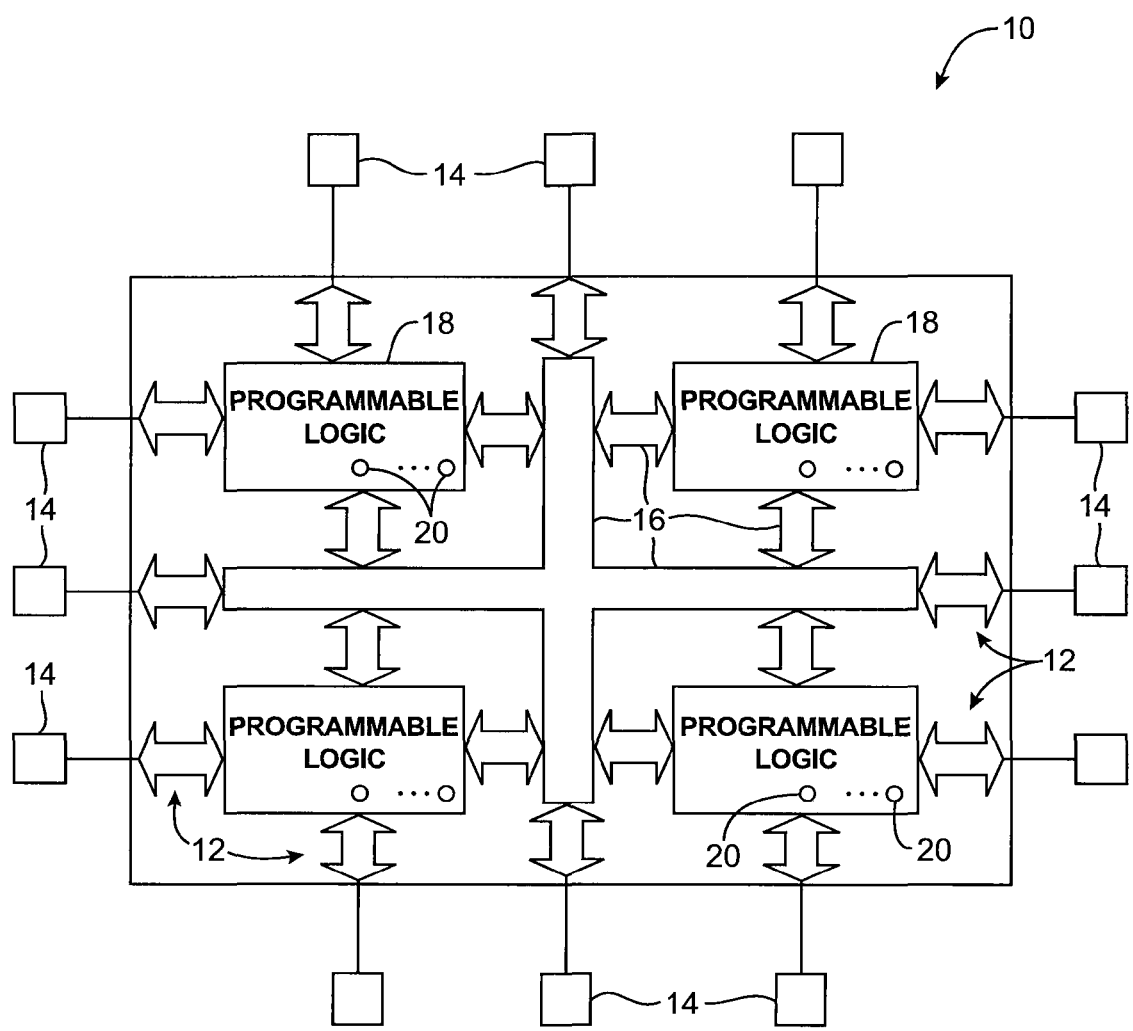
FIG. 1 is a diagram of an illustrative integrated circuit that may contain memory elements such as a programmable logic device integrated circuit in accordance with an embodiment of the present invention.

The present invention relates to integrated circuits containing memory elements. The integrated circuits may be memory chips, digital signal processing circuits with memory arrays, microprocessors, application specific integrated circuits with memory arrays, programmable logic device integrated circuits in which memory elements are used for configuration memory, or any other suitable integrated circuit.

The memory elements may be volatile memory elements. Loaded data may be maintained within volatile memory elements so long as the volatile memory elements are powered. Data is generally lost when power is removed.

The memory elements may be used in any suitable integrated circuit. With one illustrative arrangement, the memory elements are used to store control data for programmable logic such as programmable multiplexer circuitry on a programmable integrated circuit. In this type of arrangement, the volatile memory elements may be formed on an array on a programmable integrated circuit. During operation, each memory element in the array may produce a respective control signal that is used in controlling the operation of an associated programmable circuit element such as an n-channel or p-channel metal-oxide-semiconductor transistor in a multiplexer or other programmable circuit. The programmable integrated circuit may be a programmable logic device integrated circuit in which the loaded memory element data is used in programming associated programmable logic. Data of this type is generally referred to as programming data or configuration data.

Programmable logic devices can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit from the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can drastically reduce the amount of effort required to implement a desired integrated circuit design.

Memory elements such as the memory elements that may be used to store configuration data on programmable logic device integrated circuits may be powered using a positive power supply voltage and a ground. The positive power supply voltage may be referred to as Vcccell and may be the same power supply voltage that is used to power the main "core" logic on a programmable logic device integrated circuit or other integrated circuit. The ground voltage may be referred to as Vgndcell and may be the same ground power supply voltage that is using in powering the core logic (as an example).

Integrated circuits that operate at low power supply voltages may offer benefits over integrated circuits that operate at higher power supply voltages. For example, reductions in the power supply voltage that is used in powering the core logic on an integrated circuit generally lead to reduced power consumption. Because of these benefits, the semiconductor industry is continually striving to produce processes and circuit designs that support reductions in power supply voltages. Examples of suitable positive power supply voltages that may be used in powering memory elements and core logic are 1.5 volts, 1.2 volts, 1.0 volts, and 0.9 volts. Other positive power supply voltages may also be used. For example, a positive power supply voltage Vcccell of greater than 1.0 volts or less than 1.0 volts may be used in powering memory elements and core logic on an integrated circuit. Ground voltage Vgndcell may be 0 volts or any other suitable voltage and may be used in powering memory elements and core logic.

Circuit area ("real estate") is generally at a premium in modern integrated circuit designs. Circuits with small components can experience enhanced manufacturing yields, lower costs, and improved performance. In contrast, designs that use circuit real estate inefficiently may be costly to produce and may not perform as well as more compact arrangements.

As a result of these considerations, is desirable to minimize the amount of area consumed by the transistors in the memory elements on an integrated circuit. Memory elements typically include cross-coupled inverters that serve as bistable data storage elements. The inverters generally include p-channel and n-channel transistors.

Each memory element may also have an associated address transistor. Address transistors may be used in addressing groups of memory elements during read and write operations. For example, all of the memory elements in a given column of a memory array may share a common address line. Address transistors may be coupled between the address line and respective cross-coupled inverters in the memory elements. When the address line is asserted, the address transistors may be turned on, coupling the inverters to respective data lines.

Memory elements may also each have an associated clear transistor. Clear transistors may be used to selectively clear the memory elements during power up or reconfiguration operations. Each clear transistor may have a gate terminal that is connected to a clear control signal path and source-drain terminals connected respectively to a power supply terminal and an output associated with one of the cross-coupled inverters in the memory element. The clear control signal path may be used to provide a clear control signal to the clear transistors. When the clear signal is asserted, the clear transistors may be turned on to clear the contents of the memory elements.

To minimize the amount of circuit real estate associated with the memory elements, it is desirable to use a transistor layout that helps to reduce the amount of area consumed by the inverter transistors, address transistor, and clear transistor in each memory element. With one suitable arrangement, the memory elements have p-channel metal-oxide-semiconductor clear transistors and use a layout that efficiently implements the clear transistors, address transistors, and inverter transistors in the memory cell. This type of arrangement may help to minimize the cell size for each memory element. The layout of associated programmable logic components such as programmable multiplexers may be configured to accommodate this type of memory element layout and may therefore further assist in minimizing the overall circuit area consumed on an integrated circuit to implement a given amount of circuitry.

An integrated circuit 10 in which memory elements and associated programmable circuitry of this type may be provided is shown in FIG. 1. Integrated circuit 10 may be any suitable integrated circuit, such as a programmable logic device integrated circuit (as an example).

As shown in FIG. 1, programmable logic device integrated circuit 10 may have input/output circuitry 12 for driving signals off of device 10 and for receiving signals from other integrated circuits via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory elements 20 that can be loaded with data such as configuration data (also called programming data) using pins 14 and input/output circuitry 12. Once loaded, the memory elements may each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers. Some of the output signals may be used to control p-channel metal-oxide-semiconductor (PMOS) transistors such as power-down transistors.

When a memory element supplies a high output to a NMOS pass transistor, the transistor is turned on and passes logic signals from its input to its output. When the memory element output is low, the pass transistor is turned off and does not pass logic signals. Being able to configure pass transistors in this way allows the programmable logic of the programmable logic device to be programmed to implement a desired logic design.

When a memory element supplies a low output to a PMOS power-down transistor, the transistor is turned on. This allows a block of associated logic circuitry to receive power. When the memory element supplies a high output to the PMOS power-down transistor, the transistor is turned off. This powers down the block of circuitry.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from an external source such as a configuration device integrated circuit via pins 14 and input/output circuitry 12. The loaded memory elements 20 provide static control signals that are applied to the terminals of circuit elements in programmable logic 18 to turn certain circuit elements on or off and thereby configure the logic in programmable logic 18. The circuit elements may be parts of multiplexers, look-up tables, logic arrays, AND, OR, NAND, and NOR logic gates, etc. There may be any suitable number of memory elements 20 on device 10. For example, there may be thousands or millions of memory elements 20 on device 10.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
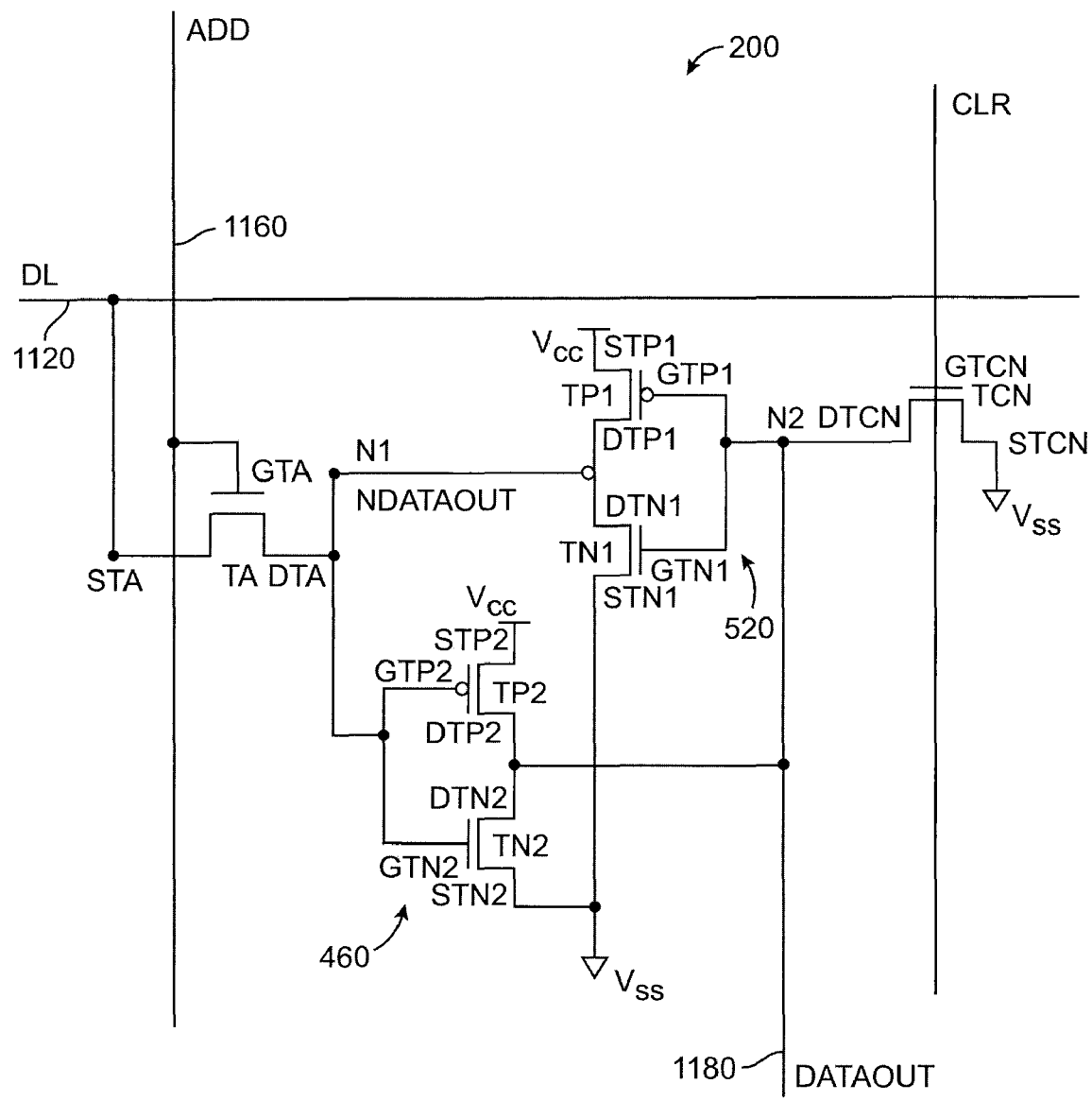
FIG. 2 is a diagram of a conventional memory element.

A conventional programmable logic device memory element 200 is shown in FIG. 2. As shown in FIG. 2, memory element 200 may be formed from two cross-coupled inverters—inverter 460 and inverter 520. Inverter 460 has a p-channel metal-oxide-semiconductor (PMOS) transistor TP2 and an n-channel metal-oxide-semiconductor (NMOS) transistor TN2. Inverter 520 has PMOS transistor TP1 and NMOS transistor TN1. Inverters 460 and 520 are said to be cross-coupled because the output of inverter 520 is connected to the input of inverter 460 and vice versa.

Inverters 460 and 520 form a bistable memory element. In one stable state (which is generally referred to as the "cleared" state of memory element 200), signal NDATAOUT at the output of inverter 520 (node N1) is high (e.g., at Vcc) and represents a logic one, whereas signal DATAOUT at the output of inverter 460 (node N2) is low (e.g., at Vss) and represents a logic zero. In the other stable state (which is generally referred to as the "programmed" state of memory element 200), signal NDATAOUT is low and signal DATAOUT is high. During normal operation of the programmable logic device containing memory elements such as memory element 200 of FIG. 2, the output of memory element 200 on line 1180 (i.e., signal DATAOUT) is applied to the gates of programmable transistors.

Clear transistor TCN is used in clearing memory element 200. As shown in FIG. 2, transistor TCN is an re-channel metal-oxide-semiconductor transistor. As a result, transistor TCN may be turned on by taking clear control signal CLR on gate GTCN of transistor TCN to a logic high level (i.e., by asserting signal CLR to take CLR to Vcc). Transistor TCN may be turned off by taking signal CLR low. When signal CLR is deasserted (i.e., when CLR is low at ground voltage Vss), transistor TCN is off and the input of inverter 520 is not electrically connected to ground voltage Vss. When signal CLR is asserted, transistor TCN is on so that its source-drain terminals (i.e., source STCN and drain DTCN) are connected to the other. In this situation, signal DATAOUT and node N2 are pulled low to ground power supply voltage Vss.

During data writing operations, address signal ADD is asserted to address memory element 200. Other memory elements 200 in the same column are addressed in this way at the same time. When address line 1160 is taken high, address transistor TA is turned on and the data signal DL on data line 1120 is driven into the memory element 200 on node N1. Clear operations are preferably performed before data writing operations. Following clear operations, node N1 will be high. If the data signal DL on line 1120 during data writing is high, node N1 will remain high. The output DATAOUT in this situation will be low. If the data signal DL on data line 1120 is low, node N1 will be taken low during the write operation, because transistor TA is configured to be strong enough to overpower inverter 520. Due to the inversion of the low N1 signal by inverter 460, the voltage on node N2 will taken high. This will make the output DATAOUT high.

During data read operations, a desired address line 1160 is asserted while the resulting signals on the data lines 1120 are monitored by read and write control circuitry on the integrated circuit. Prior to read operations, each data line 1120 on the integrated circuit may be precharged using a weak pull-up PMOS transistor. If the signal on a given node N1 is high (i.e., if DATAOUT is low), data signal DL on the associated data line 1120 will be high during read operations. If the signal on a given node N1 is low (i.e., if DATAOUT is high), inverter 520 will pull data signal DL on data line 1120 low during the read operation.

After an array of memory elements 200 has been successfully loaded and any desired data read operations have been performed to ensure that the data has been loaded properly, memory elements 200 may be used to support normal operation of the integrated circuit. For example, each memory element 200 may supply a corresponding output control signal on its path 1180. The DATAOUT signal on each memory element's path 1180 may be applied to the gate of a corresponding programmable transistor in a programmable component such as a programmable multiplexer.

In the conventional arrangement of FIG. 2, clear operations are performed using an n-channel metal-oxide-semiconductor (NMOS) clear transistor TCN. This type of configuration may operate satisfactorily, but may make it difficult to minimize the size of memory element 200 and corresponding programmable multiplexer circuitry connected to data output line 1180.

Figure 3:
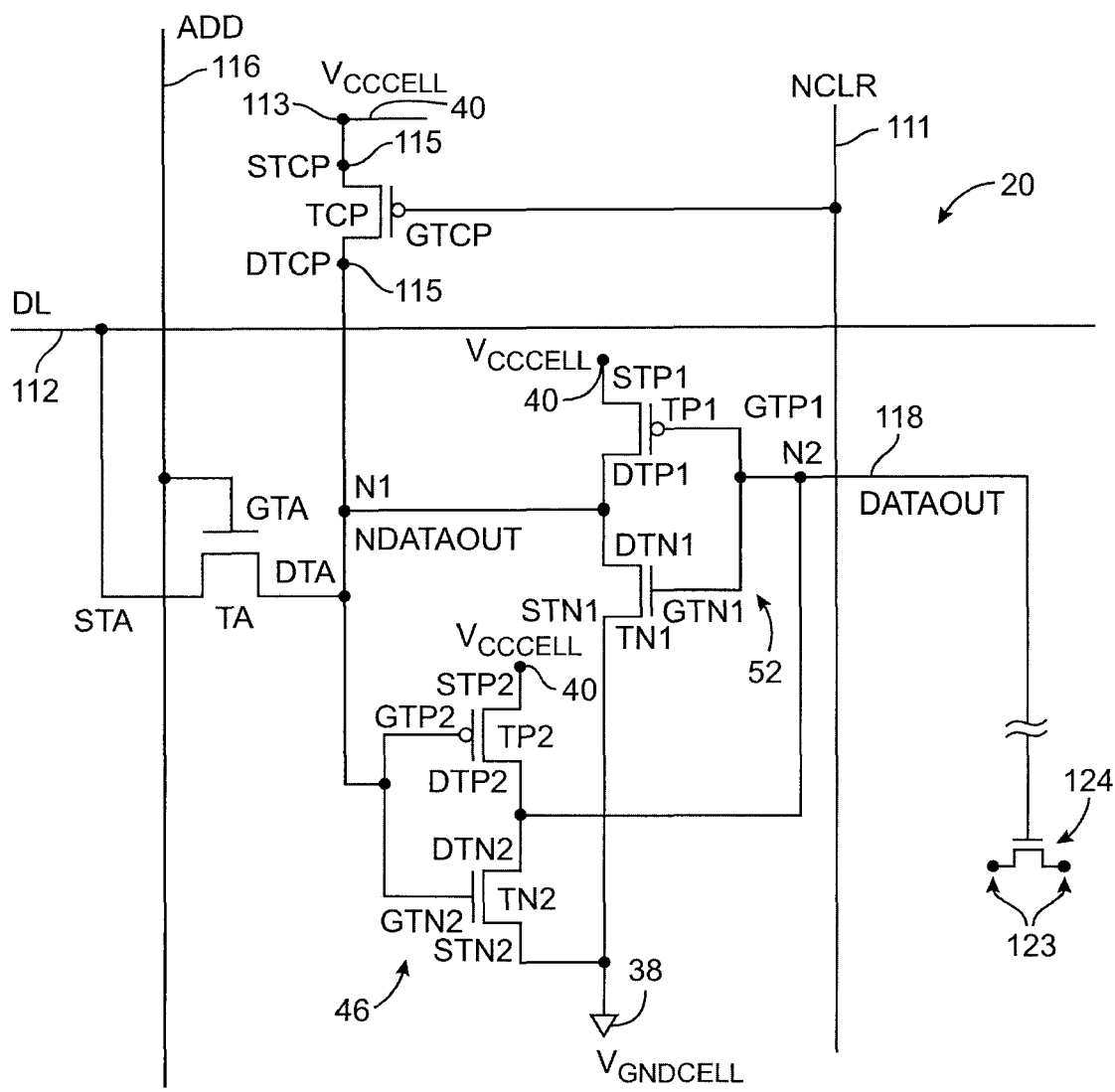
FIG. 3 is a diagram of an illustrative memory element in accordance with an embodiment of the present invention.

In accordance with an embodiment of the present invention, clear functions may be implemented using a p-channel metal-oxide-semiconductor (PMOS) clear transistor. This type of configuration is shown in FIG. 3. Memory element 20 of FIG. 3 may be used in an array of memory elements on an integrated circuit such as programmable logic device integrated circuit 10 of FIG. 1. As shown in FIG. 3, memory element 20 may be formed from two cross-coupled inverters—inverter 46 and inverter 52. Inverter 46 may have a p-channel metal-oxide-semiconductor (PMOS) transistor TP2 and an n-channel metal-oxide-semiconductor (NMOS) transistor TN2. Inverter 52 may have a PMOS transistor TP1 and an NMOS transistor TN1.

As with conventional memory element 200 of FIG. 2, memory element 20 of FIG. 3 may form a bistable memory element having cleared and programmed stable states. In the cleared state of memory element 20, signal NDATAOUT at the output of inverter 52 (node N1) is high (e.g., at Vcccell) and represents a logic one, whereas signal DATAOUT at the output of inverter 46 (node N2) is low (e.g., at Vgndcell) and represents a logic zero. In the programmed state of memory element 20, signal NDATAOUT is low and signal DATAOUT is high. During normal operation of device 10, the output of memory element 20 on line 118 (i.e., signal DATAOUT) is applied to the gates of programmable transistors (e.g., transistor 124).

Power supply signals Vcccell and Vgndcell may have any suitable fixed or time-varying values. For example, positive power supply signal Vcccell may have a value of 1.0 volts (as an example) and ground power supply signal Vgndcell may have a value of 0 volts (as an example). These are merely illustrative values. Any suitable values may be used for Vcccell and Vgndcell if desired. Values of 1.0 volts for Vcccell and 0 volts for Vgndcell are only used as examples.

Clear transistor TCP is used in clearing memory element 20. In the example of FIG. 3, transistor TCP is a p-channel metal-oxide-semiconductor transistor. As a result, transistor TCP may be turned on by taking clear control signal NCLR on gate GTCP of transistor TCP to a logic low level (i.e., by asserting clear control signal NCLR to take NCLR to ground). Transistor TCP may be turned off by taking signal NCLR high. When signal NCLR is deasserted (i.e., when NCLR is high), transistor TCP will be off and the output of inverter 52 will not be electrically connected to power supply voltage Vcccell at terminal 113. When signal NCLR is asserted, transistor TCP is on so that its source-drain terminals 115 (i.e., source STCP and drain DTCP) are electrically connected to each other. In this situation, terminal 113 is connected to the output of inverter 52, pulling signal NDATAOUT and node N1 high to positive power supply voltage Vcccell.

During data writing operations, the address signal ADD on address line 116 is asserted to address memory element 20. Memory elements 20 may be organized in an array on integrated circuit 10. Other memory elements 20 in the same column of the array as the addressed memory element are generally addressed at the same time.

When address line 116 is taken high in a given memory element 20, address transistor TA is turned on and the data signal DL on data line 112 is driven into the memory element 20 on node N1. Clear operations are preferably performed before data writing operations. Following clear operations, node N1 will be high. If the data signal DL on line 112 during data writing is high, node N1 will remain high. The output DATAOUT in this situation will be low. If the data signal DL on data line 112 is low, node N1 will be taken low during the write operation. To ensure that the node N1 will be taken low, transistor TA may be configured to be strong enough to overpower inverter 52. Due to the inversion of the low N1 signal by inverter 46, the voltage on node N2 will taken high. This will make the output DATAOUT high.

During data read operations, a desired address line 116 may be asserted while the resulting signals on the data lines 112 are monitored by read and write control circuitry 100. If desired, each data line 112 may be precharged using a weak pull-up PMOS transistor or other suitable circuitry prior to data read operations. If the signal on a given node N1 is high (i.e., if DATAOUT is low), data signal DL on the associated data line 112 will be high during read operations. If the signal on a given node N1 is low (i.e., if DATAOUT is high), inverter 52 will pull data signal DL on data line 112 low during the read operation.

After the array of memory elements 20 has been successfully loaded and any desired data read operations have been performed to ensure that the data has been loaded properly, memory elements 20 may be used to support normal operation of device 10. For example, in the context of a programmable logic device integrated circuit, each memory element 20 may supply a corresponding output control signal on its path 118. The DATAOUT signal on each memory element's path 118 may be applied to the gate of a corresponding programmable transistor. For example, the DATAOUT signal may be applied to the gate of an NMOS pass transistor in a programmable multiplexer or other programmable logic 18. In this type of arrangement, the pass transistor will be off when DATAOUT is low. When DATAOUT is high, the pass transistor will be on and will allow data to flow between its source-drain terminals (e.g., between source-drain terminals 123 of FIG. 3). If desired, memory elements 20 may be used to store control signals for PMOS transistors (e.g., on a programmable logic device integrated circuit or other suitable integrated circuit). PMOS transistors may be used as power-down transistors to selectively turn off unused portions of circuitry when it is desired to conserve power (as an example).

When clearing memory element 20, clear transistor TCP must drive a logic one onto node N1. Once node N1 and signal NDATAOUT have been pulled high to Vcccell by transistor TCP, the inversion operation performed by inverter 46 will pull node N2 and signal DATAOUT on path 118 low. The success of this clearing operation requires that clear transistor TCP be able to overpower inverter 52 and, in particular, that TCP be strong enough to overpower NMOS transistor TN1 in inverter 52. This may be accomplished by making TCP larger (and therefore stronger) than transistor TN1 and/or by modulating the power supply voltages in memory element 20 during clear operations (e.g., to momentarily weaken inverter 52 relative to transistor TCP).

Figure 4:
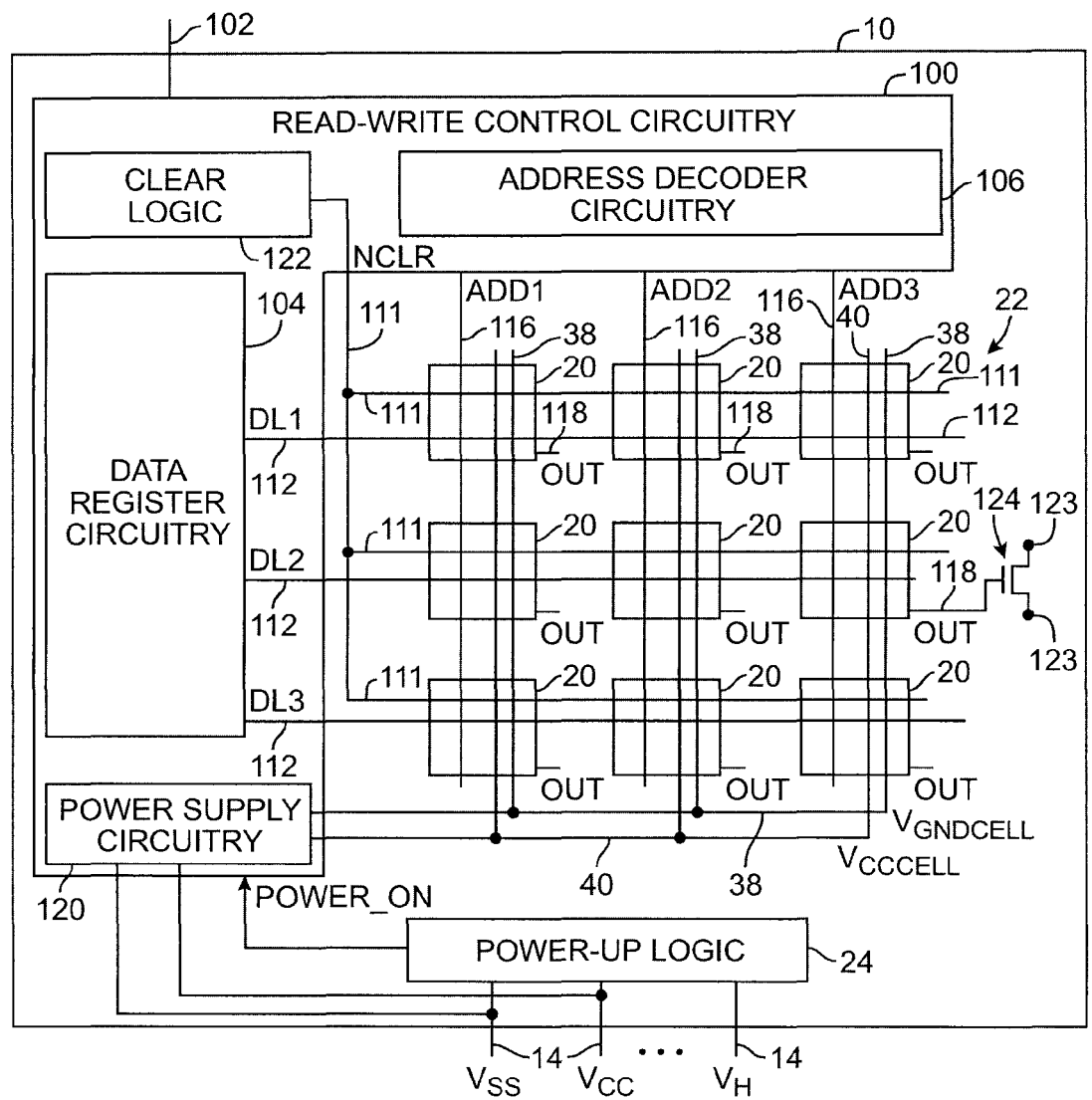
FIG. 4 is a diagram of an illustrative integrated circuit such as a programmable logic device integrated circuit that has an array of memory elements and associated read and write control circuitry in accordance with an embodiment of the present invention.

When memory elements are arranged in an array, horizontal and vertical conductors and associated loading circuitry may be used to load the memory elements with configuration data. An illustrative data loading arrangement that may be used to load an array of memory elements 20 in programmable logic device integrated circuit 10 is shown in FIG. 4. The arrangement of FIG. 4 is depicted as having a 3×3 array 22 of memory elements 20 to avoid over-complicating the drawings, but actual memory arrays may have hundreds or thousands of rows and columns.

Array 22 may receive power from positive power supply line 40 and ground power supply line 38. As shown in FIG. 4, device 10 may receive power supply signals such as positive power supply signal Vcc and ground power supply signal Vss from external sources using input-output pins 14. Positive power supply signal Vcc may have any suitable voltage (e.g., 1.0 volts, a voltage greater than 1.0 volts, or a voltage less than 1.0 volts). Ground power supply signal Vss may have a voltage of 0 volts or other suitable ground signal voltage. If desired, additional power supply voltages may be supplied to device 10. For example, one or more elevated power supply voltages Vh may be provided to device 10. Power supply voltages such as voltages Vcc, Vss, and Vh may also be generated internally based on externally-received voltages. As an example, on-chip voltage divider circuitry, charge pump circuitry, or other power regulator circuitry may be used in generating suitable power supply voltages. Voltages such as voltage Vh may be larger than Vcc and may be applied to portions of device 10 when an elevated power supply voltage is desired.

Device 10 may have power-up logic 24. Power-up logic 24 may receive power supply signals such as Vcc, Vss, and Vh and may process these signals to determine when the power supply levels on device 10 have reached their desired levels. When power-up logic 24 has determined that the power supply signals on device 10 are valid, a suitable control signal such as signal POWER_ON may be asserted. This control signal may be used to activate circuitry on device 10 (e.g., circuitry that would not function properly before power-up operations are complete).

Memory array read and write control circuitry 100 may be used to control operations such as data loading, data read operations, and clear operations. Read-write control circuitry 100 may include power supply circuitry 120. Power supply circuitry 120 may receive power supply voltages such as power supply voltages Vss and Vcc and control signals such as control signal POWER_ON and may produce corresponding memory array and core logic power supply signals. With one suitable arrangement, a power supply voltage equal to Vss and a power supply voltage equal to Vcc may be used as a core logic power supply voltages for core logic on device 10 (e.g., core programmable logic 18).

Power supply circuitry 120 may also produce memory array power supply signals Vcccell and Vgndcell. Positive power supply signal Vcccell may be routed to memory elements 20 in array 22 using power supply path 40. Ground power supply signal Vgndcell may be routed to memory elements 20 in array 22 using power supply path 38.

Power supply signals Vcccell and Vgndcell may have voltages that vary as a function of time (e.g., depending on the nature of the operations being performed by read-write control circuitry 100, etc.) or may have fixed values. For example, positive power supply signal Vcccell may be equal to 1.0 volts (i.e., Vcc) and ground power supply signal Vgndcell may be equal to 0 volts (i.e., Vss).

A clear control signal path 111 (labeled NCLR) may be used to route the clear control signal NCLR to memory elements 20 from clear logic 122. The signal NCLR may be asserted by clear logic 122 (e.g., by taking NCLR low to turn on associated p-channel clear transistors TCP in elements 20) when it is desired to clear the contents of the memory array 22. Array 22 may be cleared on power-up or later, as part of a memory array reconfiguration operation. After array 22 has been cleared, configuration data may be loaded from data register circuitry 104. Clear logic 122 may, if desired, be responsive to control signals received from path 102.

Configuration data or other suitable data may be provided in series to data register circuitry 104 via path 102 (e.g., from an external source). This data may then be provided in parallel to array 22 via data lines 112. In the example of FIG. 4, three data signals DL1, DL2, and DL3 are shown, because there are three corresponding rows of memory elements 20. This is merely illustrative. There may be any suitable number of rows of memory elements 20 in array 22 and any suitable number of data lines 112.

Address decoder circuitry 106 may receive addressing information via input 102. In response, address decoder circuitry 106 may assert a desired one of the address lines 116 (e.g., by taking an appropriate one of signals ADD1, ADD2, or ADD3 to a logic high value). When an address line is asserted in a given column during data loading operations, the data on the data lines 112 may be loaded into the memory elements 20 in that column. The array may be filled by systematically loading the memory elements in each of the columns of the array. After the array has been completely loaded with configuration data, the output 118 of each memory element 20 may produce a corresponding static output control signal for controlling the gate of a transistor in programmable logic 18 (FIG. 1) such as illustrative transistor 124 (FIG. 3). During data read operations (e.g., to confirm successful loading of elements 20), address lines 116 may be systematically asserted while data is conveyed from memory elements 20 to data register circuitry 104 via data lines 112.

Figure 5:
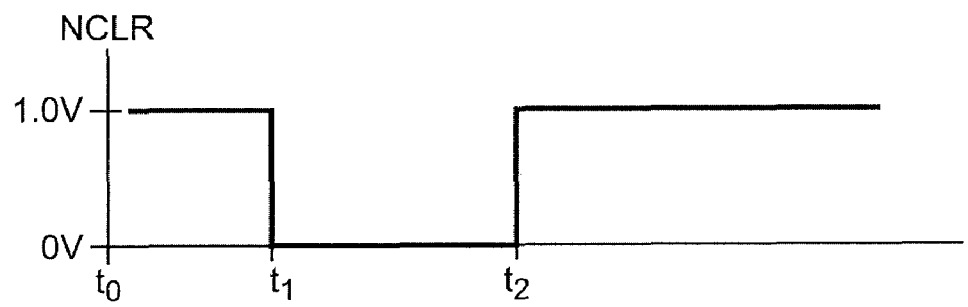
FIG. 5 shows graphs of illustrative signal voltages involved when clearing memory elements and loading data into memory elements of the type shown in FIG. 3 using circuitry of the type shown in FIG. 4 in accordance with an embodiment of the present invention.
Figure 5:
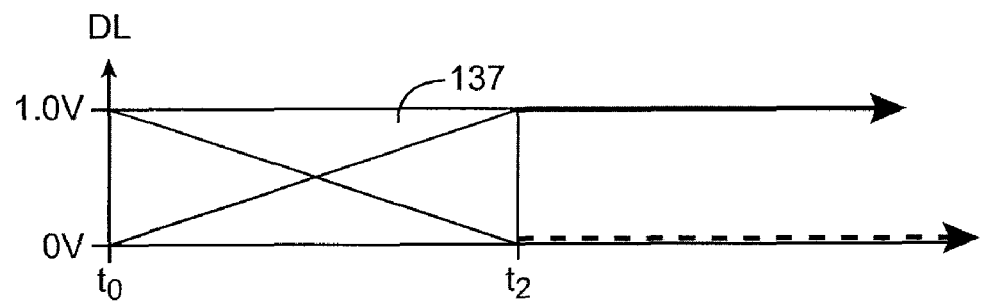
Figure 5:
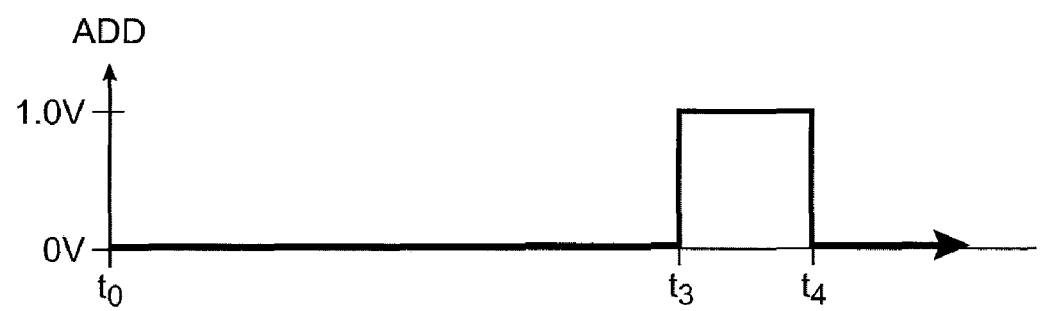
Figure 5:
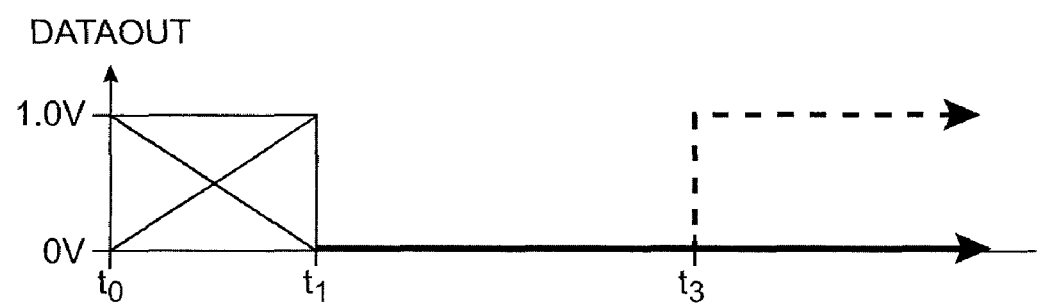

FIG. 5 shows graphs of illustrative signals that may be involved in clearing a memory element 20 and loading that memory element with data. In the example of FIG. 5, memory element 20 is being cleared as part of a reconfiguration operation. In this type of scenario, previously loaded data is cleared and then replaced with new data. If desired, memory element 20 may be cleared and loaded with data during power-up operations.

Before new data is loaded into memory array 22, memory array 22 may be cleared. As shown in FIG. 5, at times before t1, the state of data output signal DATAOUT for a given memory element is unknown, because this signal depends on the value of the previously loaded data bit in that memory element.

At time t1, clear logic 122 (FIG. 4) may assert clear signal NCLR to clear memory element 20. As shown in the first trace of FIG. 5, signal NCLR may be asserted (taken low) between times t1 and t2. When signal NCLR goes low at time t1, clear transistor TCP is turned on. This pulls signal NDATAOUT high and, following inversion of the NDATAOUT signal by inverter 46, takes signal DATAOUT low, as shown in the fourth trace of FIG. 5. At time t2, clear control signal NCLR may be deasserted to complete the clear operation.

The value of data signal DL on data line 112 at times prior to time t2 does not affect the data loading process, as indicated by box 137 in the second trace of FIG. 5. At times t2 to t3, data may be loaded into data register circuitry 104 via path 102 (FIG. 4). At times t3 to t4, address signal ADD may be asserted to load data into the memory cell.

Either a logic one or a logic zero may be loaded into each memory element. The loading of a logic zero onto node N2 is represented by solid lines at times after time t2 in the second and fourth traces of FIG. 5. The loading of a logic one onto node N2 is represented by dashed lines at times after time t2 in the second and fourth traces of FIG. 5.

To load a logic zero, data register circuitry 104 takes data signal DL high at time t2, as indicated by the solid line in the second trace of FIG. 5. With data signal DL high on data line 112, address signal ADD is asserted. As shown in the third trace of FIG. 5, address signal ADD may be asserted by taking signal ADD high at time t3. When address signal ADD is taken high, address transistor TA is turned on. This electrically connects line 112 to node N1. With transistor TA on and data signal DL at a high level on line 112, the high NDATAOUT value on node N1 and the low DATAOUT value on node N2 remain unchanged at time t3 and later, as shown by the solid line in the fourth trace of FIG. 5. At time t4, address signal ADD may be deasserted to complete the data loading process, as shown in the third trace of FIG. 5.

To load a logic one, data register circuitry 104 may take data signal DL low at time t2, as indicated by the dashed line in the second trace of FIG. 5. While data signal DL is low on data line 112, address signal ADD is asserted (at time t3). When transistor TA is turned on by the high ADD signal, data line 112 is electrically connected to node N1. Signal DL on data line 112 is low at time t3, so when TA is turned on at time t3, signal NDATAOUT on node N1 is pulled low. Due to the inversion operation of inverter 46, signal DATAOUT is taken high at time t3, as shown by the dashed line in the fourth trace of FIG. 5. At time t4, address signal ADD may be deasserted to complete the data loading process, as shown in the third trace of FIG. 5.

In accordance with an embodiment of the present invention, a compact layout may be used for the transistors of memory element 20.

Figure 6:
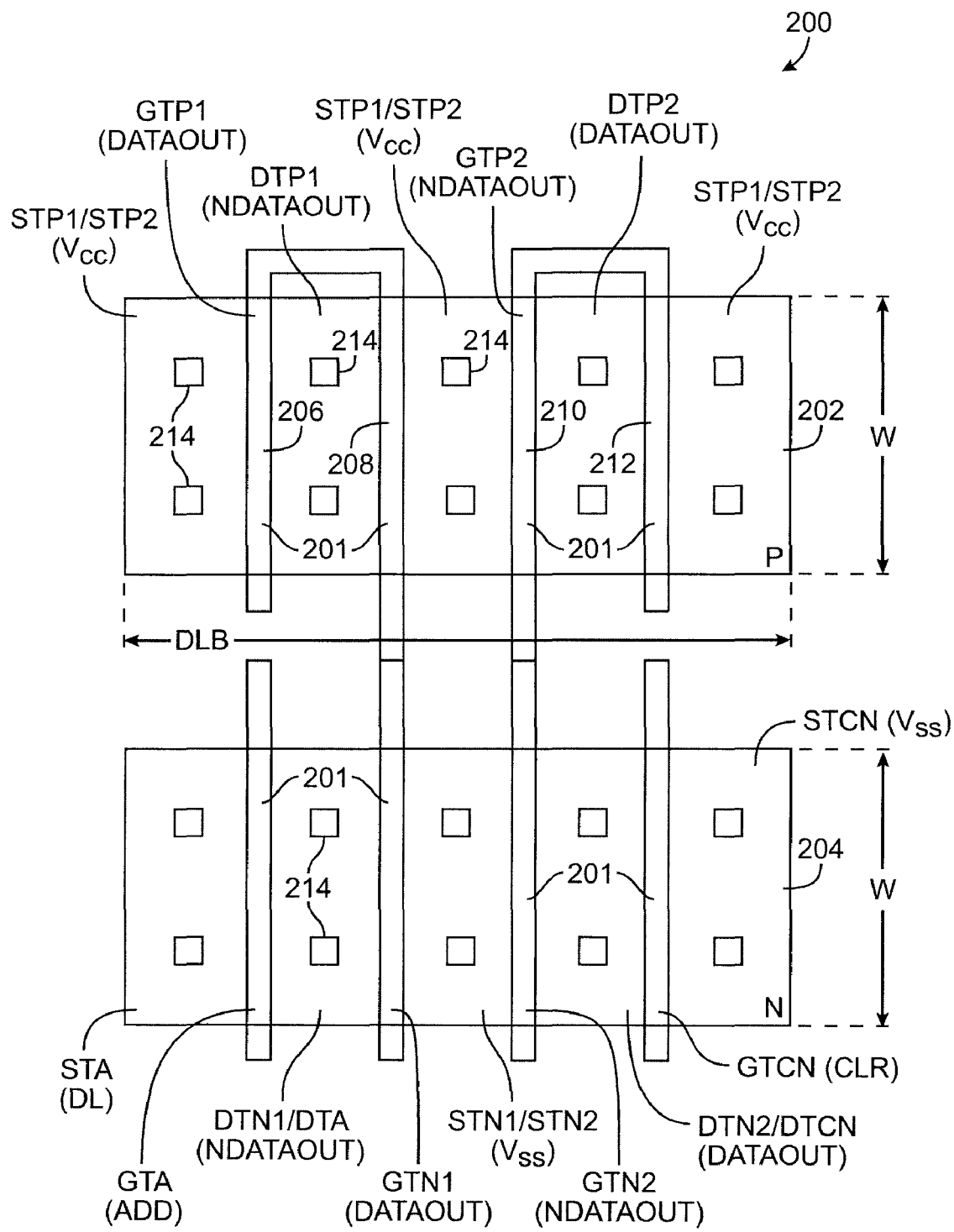
FIG. 6 is a top view of a conventional memory element transistor layout pattern.

The layout of the transistors in a conventional programmable logic device memory element such as memory element 200 of FIG. 2 is shown in FIG. 6. As shown in FIG. 6, memory element 200 may be formed from a p-type source-drain region 202 and an n-type source-drain region 204. Semiconductor regions 202 and 204 are typically formed by ion implantation into silicon. P-type region 202 may be formed in an n-well that is formed in a p-type substrate. N-type region 204 may be formed in a p-substrate. The transistors of memory element 200 are formed from regions 202 and 204. As shown in FIG. 6, the p-type sources STP1 and STP2 and p-type drains DTP1 and DTP2 for PMOS transistors TP1 and TP2 are formed from p-region 202. The n-type source STA of transistor TA, the n-type drain DTN1 of transistor TN1, the n-type drain of transistor TA, the n-type sources STN1 and STN2 of transistors TN1 and TN2, the n-type drains DTN2 and DTCN of transistors TN2 and TCN, and the n-type source STCN of transistor TCN are formed from n-type region 204.

The width W of regions 202 and 204 affects the gate widths of the memory element transistors. Because PMOS transistors tend to be weaker than NMOS transistors of the same gate width and because it is generally desirable to balance the strength of transistors TN1 and TP1 (and likewise to balance the strength of transistors TN2 and TP2), a folded gate architecture is used with the conventional memory element 200 of FIG. 6. As shown in FIG. 6, with a folded gate architecture, the gate GTP1 of transistor TP1 is formed from a gate structure that is folded back upon itself. In this configuration, gate GTP1 has a multifinger gate formed from parallel gate structure conductors 206 and 208. This folded gate structure effectively doubles the gate width of transistor TP1. The gate GTP2 of PMOS transistor TP2 is similarly doubled by the folded gate structure formed from gate portions 210 and 212.

The transistor gates of the transistors in memory element 200 are typically formed from polysilicon and must conform to semiconductor fabrication design rules. Contact holes 214 are provided throughout memory element 200 to allow suitable conductive traces to form ohmic contact with the source-drain regions of the NMOS and PMOS transistors. In the conventional arrangement of FIG. 6, there may be an array of two by five contact holes associated with region 202 and an array of two by five contact holes associated with region 204.

The design rule constraints imposed by the lateral spacing requirements for contact holes 214 and the gates of the memory element transistors and the use of the folded gate architecture make it difficult to minimize the real estate consumed by the conventional memory element 200 of FIG. 6.

Figure 7:
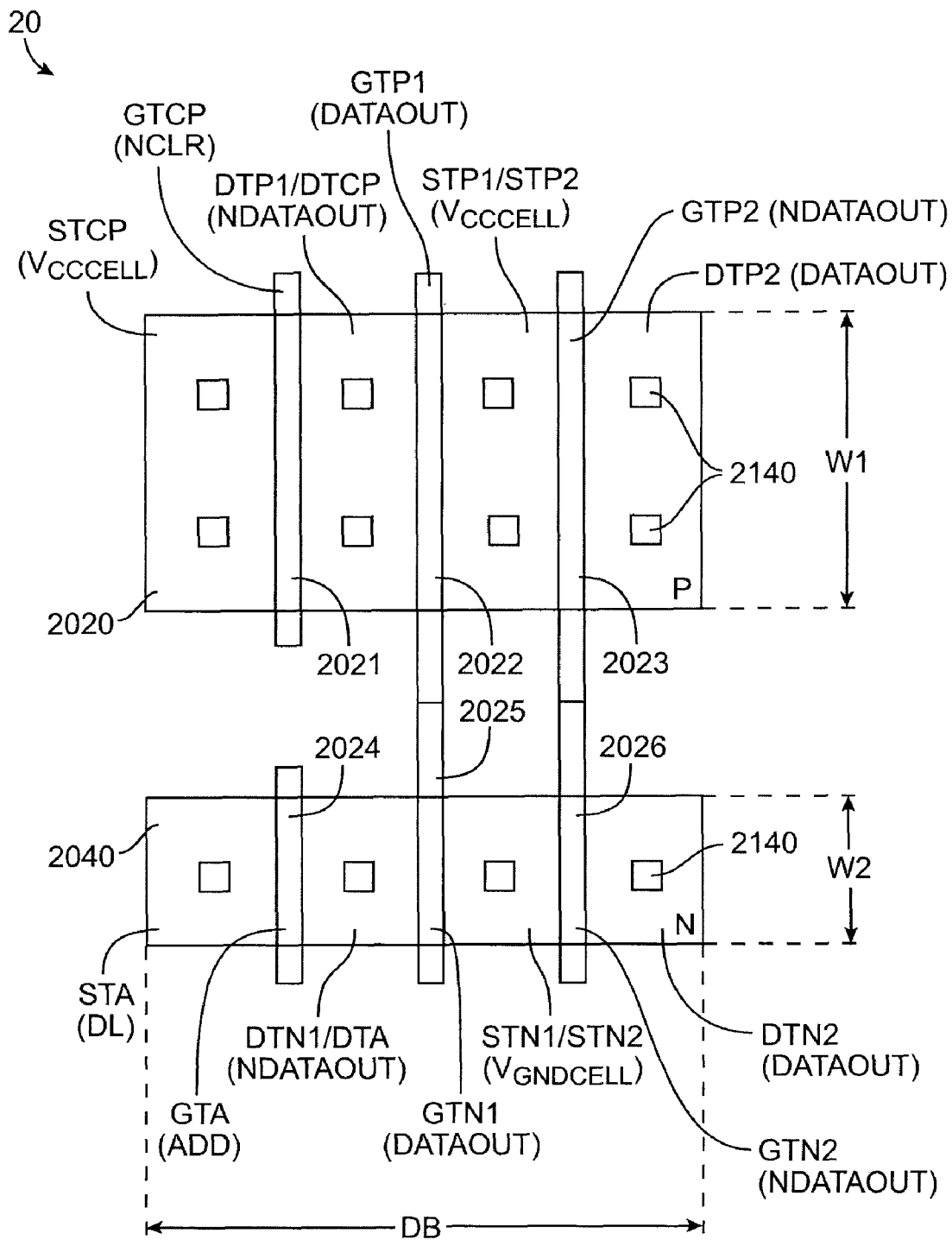
FIG. 7 is a top view of an illustrative memory element transistor layout pattern in accordance with an embodiment of the present invention.

An illustrative compact layout that may be used to form a memory element on an integrated circuit such as programmable logic device integrated circuit 10 is shown in FIG. 7. As shown in FIG. 7, a memory element 20 in accordance with an embodiment of the present invention may be formed from a p-type source-drain region 2020 and an n-type source-drain region 2040. Semiconductor regions 2020 and 2040 may be formed by ion-implantation into silicon (as an example). P-type region 2020 may be formed in an n-well that is formed in a p-type substrate (e.g., a silicon wafer). N-type region 2040 may be formed in a p-type region such as the p-substrate (as an example). The transistors of memory element 200 may be formed using regions 2020 and 2040. As shown in FIG. 7, the p-type sources STCP, STP1, and STP2 for PMOS transistors TCP, TP1, and TP2 and the p-type drains DTP1, DTP2, and DTCP for PMOS transistors TP1, TP2, and TCP may be formed from p-region 2020. The n-type source STA of transistor TA, the n-type drain DTN1 of transistor TN1, the n-type drain DTA of transistor TA, the n-type sources STN1 and STN2 of transistors TN1 and TN2, and the n-type drain DTN2 of transistor TN2 may be formed from n-type region 2040.

To balance the strength of the PMOS and NMOS inverter transistors of memory cell 20, the width W1 of p-type region 2020 may be larger than the width W2 of n-type region 2040. For example, W1 may be approximately two times as large as W2 (as an example). If desired, the area of memory element 20 may be minimized by reducing W1 and/or W2 (e.g., so that only a single row of contact holes 2140 are used in region 2040, rather than the conventional double-row arrangement of FIG. 6). Moreover, the potentially shorter dimension DB that may be used in forming regions 2120 and 2040 as compared to dimension DLB of conventional memory element 200 (FIG. 6) may help to reduce the area consumed by memory element 20.

The gate lines of memory element 20 may be formed from conductive polysilicon lines (e.g., silicided polysilicon), metal, metal alloys, or any other suitable conductive traces. As shown by comparing the layouts of FIGS. 6 and 7, the layout of the transistors of memory element 200 (FIG. 7) has only three gate fingers that cross region 2020 (i.e., gates 2021, 2022, and 2023) and three aligned gate fingers that cross region 2040 (i.e., gate structures 2024, 2025, and 2026), whereas regions 202 and 204 of conventional memory element 200 of FIG. 6 each have four gate fingers (gate structures 201). This allows dimension DB of FIG. 7 to be smaller than dimension DLB of FIG. 6, thereby helping to minimize the circuit real estate consumed by memory element 20 relative to that of conventional memory element arrangements.

Figure 8:
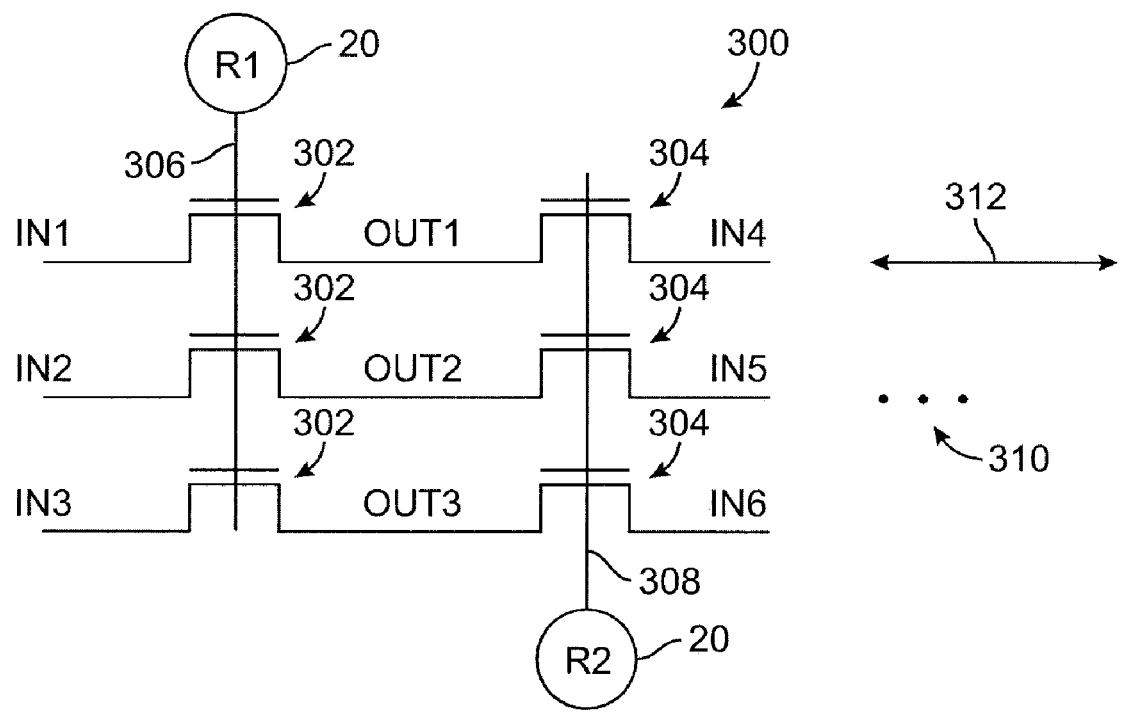
FIG. 8 is a diagram of an illustrative programmable multiplexer structure that may be formed in accordance with an embodiment of the present invention.

If desired, memory elements 20 may be used to control the states of programmable multiplexers on programmable logic device 10. An illustrative programmable multiplexer 300 is shown in FIG. 8. As shown in FIG. 8, multiplexer 300 may have six inputs (IN1, IN2, IN3, IN4, IN5, and IN6) and three outputs (OUT1, OUT2, and OUT3). In this type of configuration, multiplexer 300 forms a 6:3 multiplexer.

Programmable memory element R1 of multiplexer 300 may produce a static control signal on line 306 (i.e., a control signal DATAOUT whose value depends on the state of a configuration data bit stored in memory element R1). The static control signal may be applied to the gates of programmable NMOS transistors 302. Programmable memory element R2 may produce a static control signal on line 308 that is applied to the gates of programmable transistors 304. As indicated by dots 310, this type of multiplexer structure may be repeated numerous times on a programmable logic device integrated circuit. This allows a variety of multiplexer structures to be formed. For example, the multiplexer circuit 300 of FIG. 8 may be repeated twice to form a 12:3 multiplexer, may be repeated three times to form an 18:3 multiplexer, etc. In these situations, common output lines (e.g., interconnects connected to multiplexer outputs) may run parallel to dimension 312 (in the orientation of FIG. 8).

Figure 9:
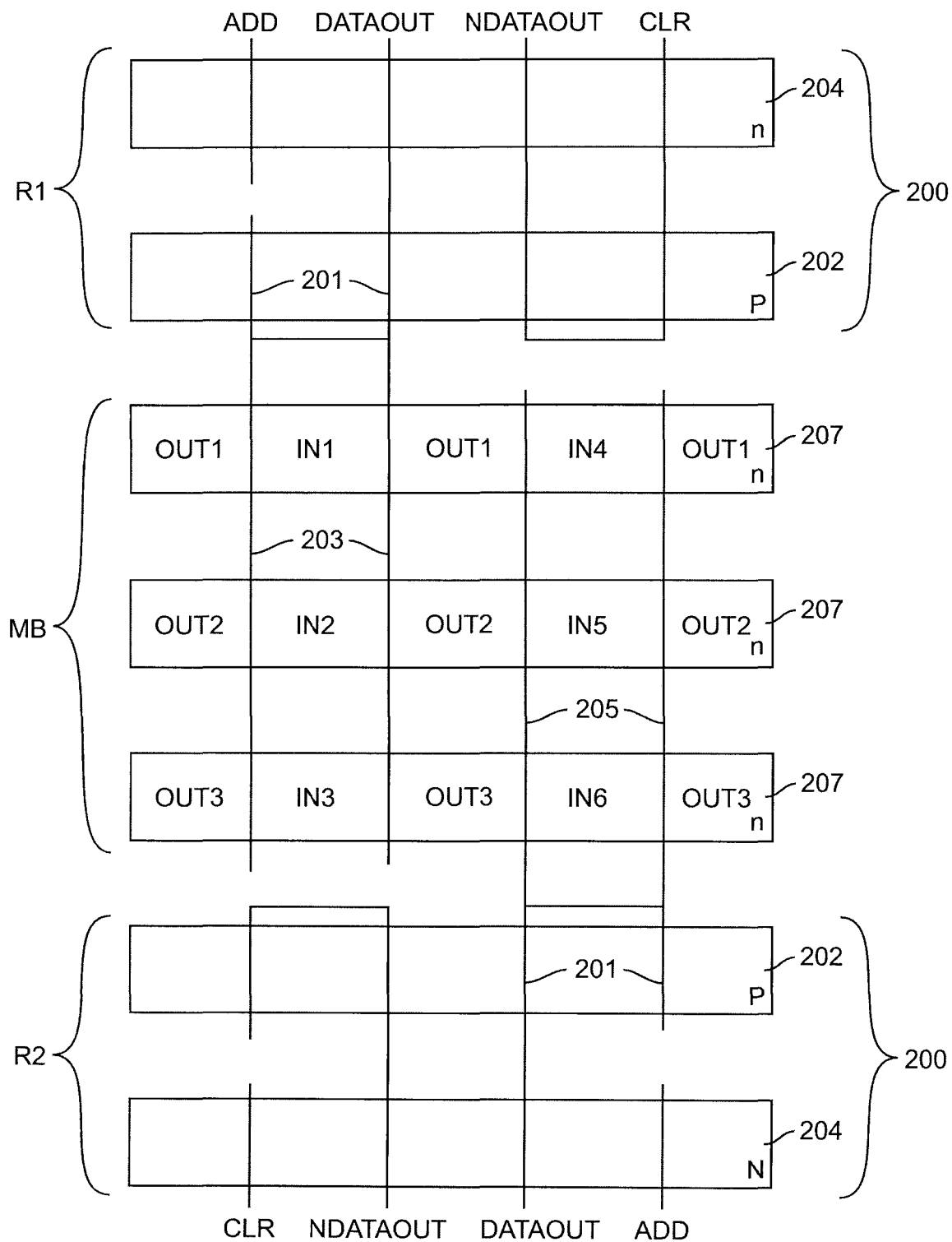
FIG. 9 is a transistor layout diagram for a conventional programmable multiplexer formed with conventional programmable memory elements.

A conventional transistor layout that may be used to fabricate a 6:3 multiplexer is shown in FIG. 9. As shown in FIG. 9, the four gate fingers of each of memory elements 200 may be extended to coincide with four mating and aligned gate fingers of 6:3 multiplexer MB. In particular, gate fingers 201 of memory element R1 may be extended to mate with corresponding gate fingers 203 for multiplexer MB. Similarly, gate fingers 201 of memory element R1 may be extended to mate with corresponding gate fingers 205 for multiplexer MB. Gate structures 203 and 205 of multiplexer MB may extend across three n-type regions 207 to form six programmable NMOS transistors for forming a 6:3 multiplexer (as described in connection with multiplexer 300 of FIG. 8).

If desired, a transistor layout of the type used for multiplexer MB of FIG. 9 or other suitable transistor layout may be used to form a programmable multiplexer that is controlled by memory elements 20 of the type described in connection with FIGS. 3 and 7. As an alternative, a multiplexer transistor layout of the type shown in FIG. 10 may be used in conjunction with memory elements 20 of the type described in connection with FIGS. 3 and 7. The FIG. 10 layout may be advantageous in integrated circuits in which circuit real estate is at a premium.

Figure 10:
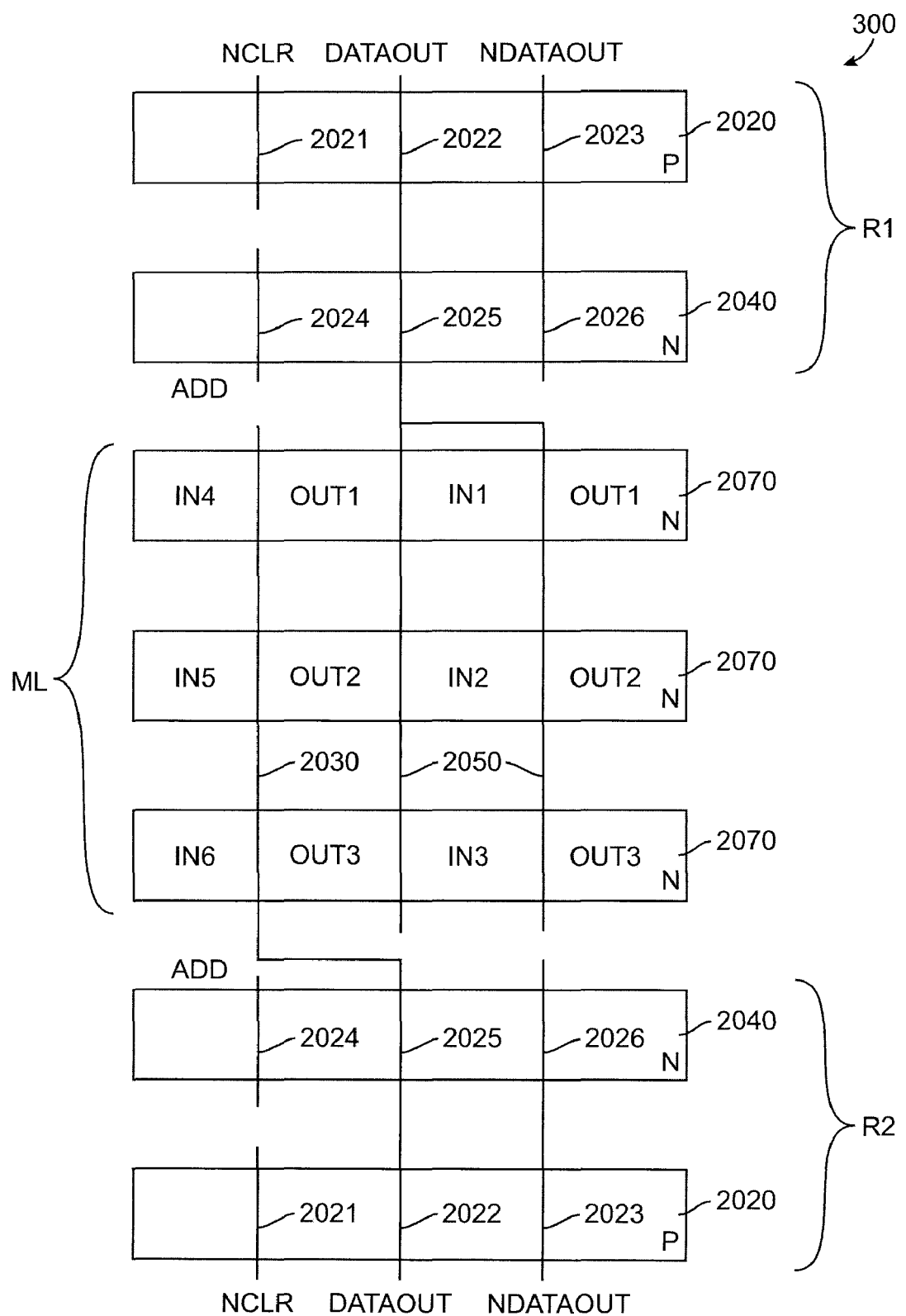
FIG. 10 is a transistor layout diagram for a programmable multiplexer formed with programmable memory elements in accordance with an embodiment of the present invention.

As shown in FIG. 10, memory elements R1 and R2 for programmable multiplexer circuitry 300 may be formed using p-type regions 2020 and n-type regions 2040. The transistors of memory elements R1 and R2 may be formed using gate conductors 2021, 2022, 2021, 2024, 2025, and 2026. The gate conductors of the transistors in FIG. 10 may be formed from polysilicon (e.g., silicided polysilicon), metal, metal alloys, or any other suitable gate conductors. Gate insulators may be formed under the gate conductors using silicon dioxide or other suitable insulators.

Multiplexer ML may be formed from gate conductors 2030 and 2050 and n-type regions 2070. Three gate conductors traverse each of the n-type and p-type doped regions that are used for forming the transistors. For example, in memory element R1, gate conductors 2021, 2022, and 2023 traverse p-type region 2020. The horizontal positions of the gate conductors in programmable multiplexer 300 are preferably aligned with each other, so that the three gate conductors that cross region 2020 in memory element R1 are horizontally aligned (in the orientation of FIG. 10) with the three gate conductors that cross region 2040 of memory element R1, are horizontally aligned with the three gate conductors that cross each of the regions 2070 in multiplexer ML, are horizontally aligned with the three gate conductors that traverse region 2040 of memory element R2, and are horizontally aligned with the three gate conductors that traverse region 2020 in memory element R2. Aligning the gates of memory elements R1 and R2 and multiplexer ML in this way helps to form a compact layout that minimizes circuit real estate. If desired, additional multiplexers may be formed by extending the pattern of FIG. 10 horizontally (e.g., by using horizontally extending conductors to connect additional output lines to outputs OUT1, OUT2, and OUT3, by forming additional memory elements 20 at positions that are horizontally adjacent to memory elements R1 and R2, etc.).

With transistor layouts of the type shown in FIG. 10, the multiplexer transistors in multiplexer ML may not all have the same strength. In particular, the transistors whose input drain-source regions are labeled IN1, IN2, and IN3 and whose output drain-source regions are labeled OUT1, OUT2, and OUT3 will generally be stronger than the transistors whose input drain-source regions are labeled IN4, IN5, and IN6 and whose output drain-source regions are labeled OUT1, OUT2, and OUT3. This is because the transistors whose input drain-source regions are labeled IN1, IN2, and IN3 have gates formed from two parallel gate fingers 2050 (i.e., a folded gate arrangement), whereas the transistors whose input drain-source regions are labeled IN4, IN5, and IN6 have unfolded gates each formed from a single gate finger 2030. This effectively doubles the strength of the IN1, IN2, and IN3 transistors relative to the IN4, IN5, and IN6 transistors.

The computer-aided design tools that are used during the design of a custom logic circuit in programmable logic device integrated circuit 10 may, if desired, take into account the different strengths of the different multiplexer transistors on the device. For example, the computer-aided design tools may identify critical signal paths in a given logic design that will benefit from (or that may require) the use of stronger and faster-switching multiplexer transistors and may identify uncritical signal paths in the given logic design that do not require the use of the stronger multiplexer transistors. When producing the configuration data for implementing a desired logic design, the computer-aided design tools can ensure that critical paths are routed through the IN1, IN2, and IN3 inputs to multiplexer ML so that these paths benefit from the fast switching speed of the IN1, IN2, and IN3 multiplexer transistors. Signal paths that carry signals for which timing constraints are less stringent can be routed through the IN4, IN5, and IN6 multiplexer inputs.

By routing slow signals through the weaker multiplexer transistors of multiplexer ML while routing fast signals through the stronger multiplexer transistors of multiplexer ML, timing constraints associated with a logic designer's desired logic circuit can be satisfied. At the same time, use of the compact three-finger transistor layout of multiplexer ML and associated memory elements R1 and R2 may allow circuit area to be minimized.

The foregoing is merely illustrative of the principles of this invention and various modifications can be made by those skilled in the art without departing from the scope and spirit of the invention.

What is claimed is:

1. An integrated circuit memory element, comprising:
   first and second cross-coupled inverters each having an input and an output;
   a p-channel clear transistor coupled between a positive power supply terminal and the output of the second inverter;
   an n-type region and a p-type region; and
   an n-channel address transistor, wherein the first inverter comprises a first p-channel transistor and a first n-channel transistor, wherein the second inverter comprises a second p-channel transistor and a second n-channel transistor, and wherein the first p-channel transistor, the second p-channel transistor, and the p-channel clear transistor each have a single gate finger that extends across the p-type region.

2. The integrated circuit memory element defined in claim 1 wherein the first n-channel transistor, the second n-channel transistor, and the n-channel address transistor each have a single gate finger that extends across the n-type region.

3. The integrated circuit memory element defined in claim 2 further comprising a data output line connected to the output of the first inverter.

4. The integrated circuit memory element defined in claim 2 wherein the n-type region has an n-type region width that establishes n-channel gate widths for the first n-channel transistor, the second n-channel transistor, and the n-channel address transistor, wherein the p-type region has a p-type region width that establishes p-channel gate widths for the first p-channel transistor, the second p-channel transistor, and the p-channel clear transistor, and wherein the n-channel gate widths are smaller than the p-channel gate widths.

5. The integrated circuit memory element defined in claim 4 wherein the address transistor has a source coupled to a data line that receives programmable logic device integrated circuit configuration data, a drain coupled to the output of the second inverter, and a gate that receives address signals.

6. An integrated circuit, comprising:
an array of memory elements, each memory element having:
first and second cross-coupled inverters each having an input and an output;
a p-channel clear transistor coupled between a positive power supply terminal and the output of the second inverter;
an n-type region and a p-type region; and
an n-channel address transistor, wherein the first inverter of each memory element comprises a first p-channel transistor and a first n-channel transistor, wherein the second inverter of each memory element comprises a second p-channel transistor and a second n-channel transistor, and wherein the first n-channel transistor, the second n-channel transistor, and the n-channel address transistor of each memory element each have a single gate finger that extends across the n-type region; and
a plurality of programmable transistors each having a gate that is connected to the output of a respective one of the first inverters.

7. The integrated circuit defined in claim 6 wherein the first p-channel transistor, the second p-channel transistor, and the p-channel clear transistor of each memory element each have a single gate finger that extends across the p-type region.

8. The integrated circuit defined in claim 7 wherein the plurality of programmable transistors form multiplexers each having six inputs and three outputs and each having gate conductors that are aligned with the gate fingers that extend across the p-type region.

9. The integrated circuit defined in claim 7 wherein the plurality of programmable transistors form multiplexers each having gate conductors that are aligned with the gate fingers that extend across the n-type region.

10. The integrated circuit defined in claim 7 wherein the plurality of programmable transistors form multiplexers each having six inputs and three outputs and each having gate conductors that are aligned with the gate fingers that extend across the p-type region and wherein the gate conductors are aligned with the gate fingers that extend across the n-type region.

11. The integrated circuit defined in claim 7 wherein the integrated circuit comprises a programmable logic device integrated circuit and wherein the integrated circuit further comprises control circuitry that loads programmable logic device configuration data into the memory elements.

12. The integrated circuit defined in claim 7 further comprising control circuitry that asserts a clear signal to turn on the clear transistors of the memory elements in parallel during clear operations.

13. A method for using memory elements on an integrated circuit, wherein each memory element has first and second cross-coupled inverters that each have an input and an output and that store data and wherein each memory element has a p-channel clear transistor that serves as the exclusive clear transistor for clearing the data from the memory element, the method comprising:
powering the cross-coupled inverters using a positive power supply signal and a ground; and
during clear operations, asserting a clear signal in each memory element to turn on the p-channel clear transistor in that memory element that serves as the exclusive clear transistor for that memory element, thereby coupling the input of the first inverter and the output of the second inverter to a power supply terminal at the positive power supply voltage and thereby pulling the input of the first inverter and the output of the second inverter toward the positive power supply voltage, wherein the clear operations for each memory element are performed without using any clear transistors other than the p-channel clear transistor in each memory element that serves as the exclusive clear transistor for that memory element.

14. The method defined in claim 13 wherein the integrated circuit includes a plurality of programmable logic transistors each of which is associated with a respective one of the memory elements, the method further comprising:
during operations other than data reading operations, configuring the programmable logic transistors by applying an output signal as a static control signal from each of the memory elements to the programmable logic transistor associated with that memory element, wherein the programmable logic transistors have source-drain terminals and wherein configuring the programmable logic transistors comprises:
turning on a first plurality of the programmable logic transistors, thereby configuring the first plurality of programmable logic transistors so that data signals flow between the source-drain terminals of the first plurality of the programmable logic transistors; and
turning off a second plurality of the programmable logic transistors, thereby configuring the second plurality of programmable logic transistors to prevent data signals from flowing between the source-drain terminals of the second plurality of the programmable logic transistors.

15. The method defined in claim 13 wherein the integrated circuit includes a plurality of programmable logic transistors and wherein at least some of the programmable logic transistors form multiplexers, the method further comprising:
applying output signals from the memory elements to the programmable logic transistors as static control signals to configure the multiplexers, wherein applying the output signals from the memory elements to the programmable logic transistors to configure the multiplexers comprises applying the output signal of a given one of the memory elements to gate terminals of at least two of the programmable logic transistors that form a given one of the multiplexers.

16. A method for using memory elements on an integrated circuit, wherein each memory element has first and second cross-coupled inverters that each have an input and an output and that store data and wherein each memory element has a p-channel clear transistor for clearing the data from the memory element, the method comprising:
  powering the cross-coupled inverters using a positive power supply signal and a ground;
  during clear operations, asserting a clear signal to turn on the p-channel clear transistors and thereby pull the output of the second inverter toward the positive power supply voltage;
  applying an output signal from each of the memory elements to a corresponding programmable logic transistor as a static control signal, wherein at least some of the programmable logic transistors form multiplexers and wherein each multiplexer has at least one n-type region that is crossed by only three gate fingers; and
  applying the output signals from the memory elements to the programmable logic transistors to configure the multiplexers.

17. A method for using memory elements on an integrated circuit, wherein each memory element has first and second cross-coupled inverters that each have an input and an output and that store data and wherein each memory element has a p-channel clear transistor for clearing the data from the memory element, the method comprising:
  powering the cross-coupled inverters using a positive power supply signal and a ground;
  during clear operations, asserting a clear signal to turn on the p-channel clear transistors and thereby pull the output of the second inverter toward the positive power supply voltage, wherein each memory element has at least one p-type region that is crossed by only three transistor gate fingers; and
  applying an output signal from each of the memory elements that has the p-type region that is crossed by only three transistor gate fingers to a corresponding programmable logic transistor as a static control signal.

18. A method for using memory elements on an integrated circuit, wherein each memory element has first and second cross-coupled inverters that each have an input and an output and that store data and wherein each memory element has a p-channel clear transistor for clearing the data from the memory element, the method comprising:
  powering the cross-coupled inverters using a positive power supply signal and a ground;
  during clear operations, asserting a clear signal to turn on the p-channel clear transistors and thereby pull the output of the second inverter toward the positive power supply voltage, wherein each memory element has at least one n-type region that is crossed by only three transistor gate fingers; and
  applying an output signal from each of the memory elements that has the n-type region that is crossed by only three transistor gate fingers to a corresponding programmable logic transistor as a static control signal.

19. The method defined in claim 18 wherein each memory element has at least one p-type region that is crossed by only three transistor gate fingers and wherein applying the output signal from each of the memory elements that has the n-type region that is crossed by only three transistor gate fingers to the corresponding programmable logic transistor as the static control signal comprises applying the output signal from each of the memory elements that has the p-type region that is crossed by only three transistor gate fingers and that has the n-type region that is crossed by only three transistor gate fingers to the corresponding programmable logic transistor as the static control signal.

20. The method defined in claim 19 wherein at least some of the programmable logic transistors form multiplexers, and wherein each multiplexer has at least one n-type region that is crossed by only three gate fingers, the method further comprising applying the output signals from each of the memory elements that has the p-type region that is crossed by only three transistor gate fingers and that has the n-type region that is crossed by only three transistor gate fingers to the programmable logic transistors to configure the multiplexers that each have the n-type region that is crossed by only three gate fingers.

* * * * *